United States Patent
Hooper et al.

(10) Patent No.: US 7,951,694 B2
(45) Date of Patent: May 31, 2011

(54) SEMICONDUCTOR STRUCTURE AND METHOD OF MANUFACTURE OF SAME

(75) Inventors: Stewart Edward Hooper, Oxford (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 346 days.

(21) Appl. No.: 12/200,188

(22) Filed: Aug. 28, 2008

(65) Prior Publication Data

US 2010/0052016 A1 Mar. 4, 2010

(51) Int. Cl.
    *H01L 21/20* (2006.01)
(52) U.S. Cl. ........ 438/508; 438/503; 438/505; 438/507; 257/E21.112
(58) Field of Classification Search .......... 438/503, 438/505, 507, 508; 257/E21.112
    See application file for complete search history.

(56) References Cited

U.S. PATENT DOCUMENTS

| | | | |
|---|---|---|---|
| 6,194,744 B1 | 2/2001 | Udagawa et al. | |
| 6,342,405 B1 * | 1/2002 | Major et al. | 438/46 |
| 6,674,095 B1 * | 1/2004 | Watanabe | 257/98 |

FOREIGN PATENT DOCUMENTS

WO 2006/120401 11/2006

OTHER PUBLICATIONS

Yang et al.; "Structural properties of GaN layers on Si(001) grown by plasma-assisted molecular beam epitaxy"; Journal of Applied Physics; vol. 83, No. 7; Apr. 1998; pp. 3800-3806.
Zhao et al.; "Growth of cubic GaN by phosphorus-mediated molecular beam epitaxy"; Applied Physics Letters; vol. 74, No. 21; May 1999, pp. 3182-3184.
Cheng et al.; "Selective growth of zinc-blende, wurtzite, or a mixed phase of gallium nitride by molecular beam epitaxy"; Applied Physics Letters; vol. 66, No. 12; Mar. 1995; pp. 1509-1511.
Nishimura et al.; "Growth of GaN on Si substrates—roles of BP thick layer"; Optical Materials 19; 2002; pp. 223-228.

* cited by examiner

*Primary Examiner* — Zandra Smith
*Assistant Examiner* — Christy L Novacek
(74) *Attorney, Agent, or Firm* — Renner, Otto, Boisselle & Sklar, LLP

(57) ABSTRACT

A method of manufacturing a nitride semiconductor structure includes disposing a semiconductor substrate in a molecular beam epitaxy reactor; growing a wetting layer comprising $Al_xIn_yGa_{(1-(x+y))}As(0 \leq x+y \leq 1)$ or $Al_xIn_yGa_{(1-(x+y))}P(0 \leq x+y \leq 1)$ on the substrate; in-situ annealing the wetting layer; growing a first AlGaInN layer on the wetting layer using plasma activated nitrogen as the source of nitrogen with an additional flux of phosphorous or arsenic; and growing a second AlGaInN layer on the first AlGaInN layer using ammonia as a source of nitrogen.

17 Claims, 1 Drawing Sheet

FIGURE 1
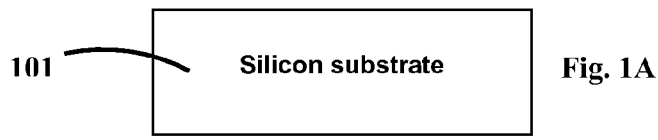
Fig. 1A
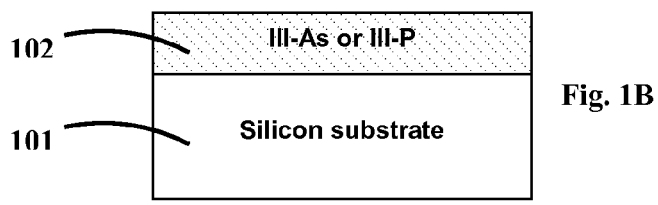
Fig. 1B
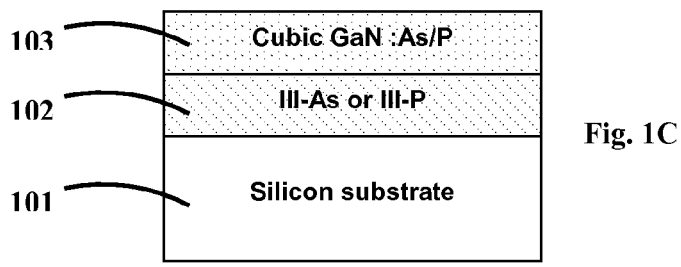
Fig. 1C
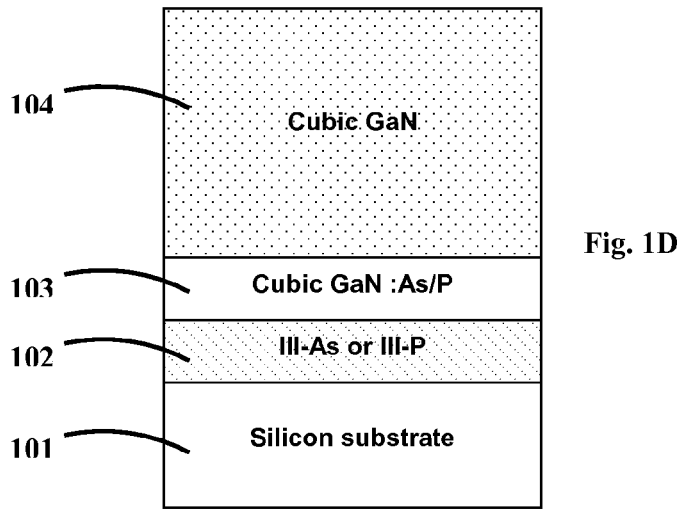
Fig. 1D

SEMICONDUCTOR STRUCTURE AND METHOD OF MANUFACTURE OF SAME

TECHNICAL FIELD

The present invention relates to a semiconductor structure, and in particular to a semiconductor structure with a zincblende crystal structure fabricated in a nitride materials system such as, for example, the (Al,Ga,In)N materials system. The present invention also relates to a method of manufacture of a zincblende semiconductor structure, and in particular to manufacture of a zincblende semiconductor structure in a nitride materials system such as, for example, the (Al,Ga,In)N materials system. The invention may also be applied to a substrate for the manufacture of an optoelectronic semiconductor device such as a light emitting diode (LED) or laser diode (LD), or an electronic semiconductor device such as a heterostructure field effect transistor (HFET) or a high electron mobility transistor (HEMT).

BACKGROUND OF THE INVENTION

Plasma assisted molecular beam epitaxy (MBE) is the deposition of a III-V semiconductor by MBE where the group V source (for example nitrogen) is generated by a plasma cell.

The (Al,Ga,In)N material system includes materials having the general formula $Al_xGa_yIn_{1-x-y}N$ where $0 \leq x \leq 1$ and $0 \leq y \leq 1$. Herein, a member of the (Al,Ga,In)N material system that has non-zero mole fractions of aluminium, gallium and indium will be referred to as AlGaInN, a member that has a zero aluminium mole fraction but has non-zero mole fractions of gallium and indium will be referred to as InGaN, a member that has a zero indium mole fraction but has non-zero mole fractions of gallium and aluminium will be referred to as AlGaN, and so on.

The (AlGaIn)N family of materials can crystallise in either the zincblende (cubic) or wurtzite (hexagonal) crystal structure. The wurtzite crystal structure is more common and it is this crystal phase which is currently used in commercial LEDs and LDs made from (AlGaIn)N. However, the zincblende crystal structure of (AlGaIn)N offers several potential advantages over the wurtzite crystal for LEDs and LDs; these are:

i) Zincblende (AlGaIn)N is a non-polar semiconductor material, i.e. the cation (Ga, Al, In) and anion (N) atom planes are not stacked sequentially. Non-polar semiconductor materials do not suffer from strong internal electric fields which can reduce the optical efficiency of the material.

ii) The electronic band structure of zincblende (AlGaIn)N predicts improved optical gain and higher p-type conductivity of the material compared to the wurtzite phase.

iii) The narrower band-gap of zincblende InGaN compared to wurtzite InGaN means less indium is required to achieve a particular optical emission wavelength. Lower indium means less defect inducing strain in the crystal.

To realise optoelectronic devices made from zincblende (AlGaIn)N, high quality zincblende (AlGaIn)N substrates are required onto which the devices are epitaxially grown by molecular beam epitaxy (MBE) or metal organic vapour phase epitaxy (MOVPE). However, high quality zincblende (AlGaIn)N substrates are difficult to achieve and are not commercially available at present.

Yang et al. have reported, in J. Appl. Phys. 83 (1998) p 3800, that zincblende GaN can be epitaxially grown on Silicon (100) using a GaAs buffer layer between the silicon and GaN to prevent the formation of amorphous SiN. However, the method of Yang et al. is undesirable as it did not produce zincblende GaN with suitable high optical quality. This is likely to be due to poor crystal quality through the use of plasma assisted MBE, which is a low temperature method, for the final GaN layer and not using arsenic or phosphorus mediated GaN epitaxy for initial growth on the GaAs layer.

Nishimura et al., Optical Mat. 19, p 223 (2002) have reported on cubic GaN grown on silicon using a boron phosphide interlayer. A table showing materials which can be grown on Si is also given; AlP, InP and GaP are in the table.

U.S. Pat. No. 6,194,744B1 discloses a method of forming zincblende (AlGaIn)N on a silicon substrate using a layer of boron phosphide between the (AlGaIn)N and silicon. This method is undesirable for zincblende (AlGaIn)N because of the difficulties associated with depositing boron phosphide, such as precursor toxicity. Also this deposition technique is limited to a vapour phase method such as MOVPE.

Zhao et al. report, in Appl. Phys. Lett. 74(21) 1999 p 3182, the use of phosphorus mediated MBE to grow zincblende GaN on a wurtzite GaN substrate. The use of a silicon substrate or a III-As/P interlayer is not mentioned by Zhao et al. Also, the method of Zhao et al. resulted in poor crystal quality and optical properties were not reported. Ammonia was not used for any of the MBE growth.

Cheng et al. discuss, in Appl. Phys. Lett. 66(12) 1995 p 1509, the use of arsenic to control the crystal phase of GaN grown on GaAs and GaP substrates by MBE. Cheng et al. make no mention of using silicon substrates or interlayers. In addition, ammonia was not used for any of the MBE growth. Moreover, PCT Publication WO2006/120401A1 describes the method of forming a bulk, free-standing zincblende III-N substrate by growing III-N material on a zincblende III-V substrate using MBE and then removing the substrate.

In view of the aforementioned shortcomings associated with conventional structures and techniques, the present invention provides a high quality zincblende (AlGaIn)N structure suitable as a substrate for zincblende (AlGaIn)N optoelectronic and electronic devices and a method of forming such a structure.

SUMMARY OF THE INVENTION

According to an aspect of the invention, a method of manufacturing a nitride semiconductor structure is provided. The method includes disposing a semiconductor substrate in a molecular beam epitaxy reactor; growing a wetting layer comprising $Al_xIn_yGa_{(1-(x+y))}As(0 \leq x+y \leq 1)$ or $Al_xIn_yGa_{(1-(x+y))}P(0 \leq x+y \leq 1)$ on the substrate; in-situ annealing the wetting layer; growing a first AlGaInN layer on the wetting layer using plasma activated nitrogen as the source of nitrogen with an additional flux of phosphorous or arsenic; and growing a second AlGaInN layer on the first AlGaInN layer using ammonia as a source of nitrogen.

According to another aspect, the substrate comprises silicon.

In accordance with another aspect, the substrate comprises germanium.

In accordance with still another aspect, the wetting layer has a thickness in the range of 1 nm to 100 nm.

In yet another aspect, the wetting layer has a thickness in the range of 10 nm to 100 nm.

According to another aspect, the wetting layer is grown at a temperature in the range of 250° C. to 500° C.

With still another aspect, the wetting layer is grown under arsenic-rich conditions.

In accordance with another aspect, the method further includes growing an additional layer of $Al_xIn_yGa_{(1-(x+y))}As$ ($0 \leq x+y \leq 1$) or $Al_xIn_yGa_{(1-(x+y))}P(0 \leq x+y \leq 1)$ on the wetting layer following the annealing and prior to the growing of the first AlGaInN layer.

Further, according to another aspect the annealing is carried out at a temperature in the range of 550° C. to 700° C.

According to yet another aspect, the first AlGaInN layer has a thickness in the range of 20 nm to 500 nm.

According to another aspect, the first AlGaInN layer is grown with gallium and nitrogen fluxes set to give nominally stoichometric growth conditions or slightly gallium-rich conditions.

In yet another aspect, the second AlGaInN layer has a thickness in the range of 1 µm to 10 µm.

In still another aspect, the second AlGaInN layer is grown at a temperature in the range of 750° C. to 1000° C.

According to another aspect, the second AlGaInN layer is grown with gallium and nitrogen fluxes set to give nitrogen-rich conditions.

In accordance with another aspect, the second AlGaInN layer is doped with at least one of silicon, magnesium or carbon.

Regarding yet another aspect, the additional layer has a thickness in the range of 0.5 µm to 3 µm.

According to still another aspect, the additional layer is grown at a temperature in the range of 450° C. to 700° C.

In accordance with another aspect of the invention, a nitride semiconductor structure is provided. The structure includes a semiconductor substrate, a wetting layer of $Al_xIn_yGa_{(1-(x+y))}As(0 \leq x+y \leq 1)$ or $Al_xIn_yGa_{(1-(x+y))}P(0 \leq x+y \leq 1)$ formed on the substrate, a first AlGaInN layer formed on the wetting layer, and a second AlGaInN layer formed on the first AlGaInN layer.

According to another aspect, the second AlGaInN layer is zincblende phase AlGaInN.

According to yet another aspect, the first AlGaInN layer is arsenic or phosphorus doped zincblende phase AlGaInN.

Regarding another aspect, the structure further includes an additional layer of $Al_xIn_yGa_{(1-(x+y))}As(0 \leq x+y \leq 1)$ or $Al_xIn_yGa_{(1-(x+y))}P(0 \leq x+y \leq 1)$ between the wetting layer and the first AlGaInN layer.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 1A-1D illustrate steps for growing a zincblende AlGaInN crystal on a silicon substrate in accordance with an exemplary embodiment of the invention. FIG. 1A shows a silicon substrate; FIG. 1B shows a structure comprising a silicon substrate with a thin layer of GaAs; FIG. 1C shows a structure comprising a silicon substrate with a thin GaAs layer and a cubic GaN layer containing arsenic; and FIG. 1D shows a final structure comprising a silicon substrate with a thin GaAs layer, then a cubic GaN layer containing arsenic, followed by a thick GaN layer.

DETAILED DESCRIPTION OF THE INVENTION

The present invention will now be described with reference to the drawings, wherein like reference numerals are used to refer to like elements throughout.

Referring to FIGS. 1A-1D, the present invention includes a method of manufacturing a nitride semiconductor structure comprising the steps of: disposing a silicon substrate 101 in a molecular beam epitaxy reactor (FIG. 1A); growing an $Al_xIn_yGa_{(1-(x+y))}As(0 \leq x+y \leq 1)$ layer 102 or an $Al_xIn_yGa_{(1-(x+y))}P(0 \leq x+y \leq 1)$ layer 102 on the silicon substrate 101 (FIG. 1B); in-situ annealing of the AlInGaAs or AlInGaP layer 102; growing an optional further layer of AlInGaAs or AlInGaP on layer 102 (thereafter represented collectively as layer 102); growing an AlGaInN layer 103 on layer 102, using plasma activated nitrogen as the source of nitrogen and with an additional flux of arsenic or phosphorus being supplied to the growth surface (FIG. 1C); and growing an AlGaInN layer 104 on layer 103, using ammonia as the source of nitrogen (FIG. 1D).

The use of an AlInGaAs or AlInGaP layer 102 grown at low growth temperature prevents the formation of SiN during the subsequent AlGaInN deposition. SiN is known to degrade the crystal quality of AlGaInN. The annealing step leads to a crystalisation and surface smoothing of the AlInGaAs or AlInGaP layer 102 and provides a suitable zincblende template surface for the subsequent AlGaInN growth. The optional step of growing a further layer of AlInGaAs or AlInGaP may be desirable to reduce any remnant defects or dislocations. The additional As or P flux supplied during the growth of the first AlInGaN layer 103 acts as a surfactant to produce a 100% zincblende crystal, i.e. no wurtzite inclusions. The first AlGaInN layer 103 seeds the next AlGaInN layer 104 which is grown at an elevated temperature and growth rate to obtain a layer with extremely high crystal quality and purity, superior to layers described in the prior art. Unlike a GaAs or GaP substrate, the silicon substrate 101 does not decompose at high temperatures, so high temperatures can be used to grow the final AlInGaN layer 104, thereby improving the crystal quality of this layer.

The AlInGaAs or AlInGaP layer 102 may have a thickness of at least 1 nanometer (nm), and it may have a thickness of less than 100 nm. Making the thickness of this semiconductor layer 102 within these limits allows complete coverage and sufficient wetting of the silicon substrate 101. The crystal and surface properties of layers of this thickness can also be modified through the subsequent anneal which follows. The use of a thin wetting layer for the growth of high quality III-V semiconductors on silicon substrates is well known and is described in detail by Fang et al. J. Appl. Phys. 68, R31-R58 (1990).

Finally, the method may include removing the final semiconductor structure represented in FIG. 1D from the MBE reactor and growing one or more further (Al,Ga,In)N layers over the nitride semiconductor structure using either MBE, MOVPE or HVPE techniques. Moreover, if this further layer is of sufficient thickness (>50 micrometers (µm)) the silicon substrate 101 may be removed to produce a free-standing nitrides substrate.

The present invention further includes a semiconductor structure fabricated in a nitride material system and comprising: zincblende phase AlGaInN layer 104 on a silicon substrate 101 such that there is a layer 102 of AlInGaP or AlInGaAs between the zincblende (cubic) phase AlGaInN layer 104 and silicon substrate 101, and there is a layer 103 of arsenic or phosphorus doped zincblende phase AlGaInN between the cubic phase AlGaInN layer 104 and AlInGaP or AlInGaAs layer 102. The semiconductor structure may be fabricated in accordance with the method described herein in relation to FIGS. 1A-1D.

EXAMPLE

As a particular example of the method and structure in accordance with the present invention, FIG. 1A illustrates a clean silicon substrate 101 that is loaded into the MBE chamber and heat treated under vacuum to remove surface oxides. A typical heat treatment is 1000° C. for 15 minutes duration. The silicon substrate 101 is then cooled under vacuum prior to carrying out the following stages:

Stage 1: AlInGaAs Deposition

FIG. 1B shows a 50 nm thick layer of AlInGaAs 102 that is deposited onto the silicon substrate 101 at a temperature of 400° C. More generally, the AlInGaAs layer 102 more preferably has a thickness in the range 10 nm to 100 nm and may be grown at a temperature in the range 250° C. to 500° C., for example. Arsenic-rich conditions are used.

The thin layer 102 is desirable to allow re-crystalisation during Stage 2. The low growth temperature is desirable to achieve full surface coverage and trapping of defects/dislocations during Stage 2.

Coating the silicon substrate 101 with the AlInGaAs layer 102 is desirable to prevent substrate nitridation and the formation of SiN during Stage 3. SiN is known to degrade the crystal quality of AlGaInN.

Stage 2: Annealing

Next, in-situ annealing of the AlInGaAs layer 102 is carried out, for example at a temperature of 620° C. for 15 minutes under an impinging arsenic flux, to crystalise the film. Reflection high energy electron diffraction (RHEED) may be used to observe crystalisation of the AlInGaAs layer 102. The AlInGaAs layer 102 may be annealed at a temperature in the range 550° C. to 700° C., for example.

Following such annealing step, an additional layer of AlInGaAs may be formed on the AlInGaAs layer 102 (in such case represented collectively in FIG. 1B as layer 102). The additional layer, if desired, may be used to reduce further any defects/dislocations and enhance smoothness. The additional layer of AnInGaAs is grown at a temperature of 580° and thickness of 1 μm, for example. Preferably, the additional layer is grown at a temperature within the range of 450° C. to 700° C. and with a thickness in the range of 0.5 μm to 3 μm.

Stage 3: Deposition of Arsenic or Phosphorus Mediated AlGaInN

As shown in FIG. 1C, an AlGaInN layer 103 is next deposited at a temperature of 600° C. onto the AlInGaAs layer 102. Plasma activated nitrogen is used and an additional flux of arsenic is supplied to ensure that the AlGaInN layer 103 grows with a zincblende form. The thickness of the AlGaInN layer 103 is 50 nm. A thickness in the range 20 nm to 500 nm is preferable. In place of arsenic, phosphorus flux may be used.

The gallium and nitrogen fluxes are set to give nominally stoichometric growth conditions or slightly gallium-rich conditions.

Stage 4: Deposition of Thick AlGaInN Layer

Finally, FIG. 1D shows that a 2 μm thick layer of AlGaInN 104 is deposited on the AlGaInN layer 103 at 900° C. using ammonia as the nitrogen source. The AlGaInN layer 104 thickness is preferably in the range of 1 micrometer (μm) to 10 μm and the deposition temperature in the range 750° C. to 1000° C. The gallium and ammonia fluxes are set to give nitrogen-rich conditions.

An n-type AlGaInN layer 104 may be achieved by doping with silicon and a p-type layer 104 by doping with magnesium or carbon.

As an optional final stage, the method may include removing the final nitride semiconductor structure as represented in FIG. 1D from the MBE reactor and growing one or more further (Al,Ga,In)N layers over the nitride semiconductor structure using either MBE, MOVPE or HVPE techniques. Moreover, if this further layer is of sufficient thickness (>50 μm) the silicon substrate may be removed to produce a free-standing zincblende nitrides substrate.

The above-described structure may then be utilized in accordance with another aspect of the invention to produce various electronic components. For example, additional conventional techniques may be performed on the above-described structure to manufacture an optoelectronic semiconductor device such as a light emitting diode (LED) or laser diode (LD), or an electronic semiconductor device such as a heterostructure field effect transistor (HFET) or a high electron mobility transistor (HEMT).

Although the invention has been shown and described with respect to certain preferred embodiments, it is obvious that equivalents and modifications will occur to others skilled in the art upon the reading and understanding of the specification. For example, a germanium substrate may be substituted for the silicon substrate 101 in the above described method and structure without departing from the scope of the invention. The present invention includes all such equivalents and modifications, and is limited only by the scope of the following claims.

What is claimed is:

1. A method of manufacturing a nitride semiconductor structure, comprising:

disposing a semiconductor substrate in a molecular beam epitaxy reactor;

growing a wetting layer comprising $Al_xIn_yGa_{(1-(x+y))}As$ ($0 \leq x+y \leq 1$) or $Al_xIn_yGa_{(1-(x+y))}P$ ($0 \leq x+y \leq 1$) on the substrate;

in-situ annealing the wetting layer;

growing a first AlGaInN layer on the wetting layer using plasma activated nitrogen as the source of nitrogen with an additional flux of phosphorous or arsenic; and growing a second AlGaInN layer on the first AlGaInN layer using ammonia as a source of nitrogen.

2. The method of claim 1, wherein the substrate comprises silicon.

3. The method of claim 1, wherein the substrate comprises germanium.

4. The method of claim 1, wherein the wetting layer has a thickness in the range of 1 nm to 100 nm.

5. The method of claim 1, wherein the wetting layer has a thickness in the range of 10 nm to 100 nm.

6. The method of claim 1, wherein the wetting layer is grown at a temperature in the range of 250° C. to 500° C.

7. The method of claim 1, wherein the wetting layer is grown under arsenic-rich conditions.

8. The method of claim 1, wherein the annealing is carried out at a temperature in the range of 550° C. to 700° C.

9. The method of claim 1, wherein the first AlGaInN layer has a thickness in the range of 20 nm to 500 nm.

10. The method of claim 1, wherein the first AlGaInN layer is grown with gallium and nitrogen fluxes set to give nominally stoichiometric growth conditions or slightly gallium-rich conditions.

11. The method of claim 1, wherein the second AlGaInN layer has a thickness in the range of 1 μm to 10 μm.

12. The method of claim 1, wherein the second AlGaInN layer is grown at a temperature in the range of 750° C. to 1000° C.

13. The method of claim 1 wherein the second AlGaInN layer is grown with gallium and nitrogen fluxes set to give nitrogen-rich conditions.

14. The method of claim 1, wherein the second AlGaInN layer is doped with at least one of silicon, magnesium or carbon.

15. The method of claim 1, further comprising growing an additional layer of $Al_xIn_yGa_{(1-(x+y))}As (0 \leqq x+y \leqq 1)$ or $Al_xIn_yGa_{(1-(x+y))}P (0 \leqq x+y \leqq 1)$ on the wetting layer following the annealing and prior to the growing of the first AlGaInN layer.

16. The method of claim 15, wherein the additional layer has a thickness in the range of 0.5 µm to 3 µm.

17. The method of claim 8, wherein the additional layer is grown at a temperature in the range of 450° C. to 700° C.

* * * * *